United States Patent [19]

Kumar et al.

[11] Patent Number: 5,712,802
[45] Date of Patent: Jan. 27, 1998

[54] THERMAL PROTECTION OF TRACTION INVERTERS

[75] Inventors: Ajith Kuttannair Kumar, Erie, Pa.; Peter Billey Macchiaroli, Jacksonville, Fla.

[73] Assignee: General Electric Company, Schenectady, N.Y.

[21] Appl. No.: 633,390

[22] Filed: Apr. 16, 1996

[51] Int. Cl.$^6$ .................................................. H01L 23/34
[52] U.S. Cl. ...................... 364/557; 257/712; 310/68 C; 318/472; 363/141; 364/524; 364/551.01
[58] Field of Search ........................... 364/480, 481, 364/483, 492, 495, 505, 506, 524, 550, 557, 558, 551.01; 363/50, 141; 374/40, 41; 290/1 B; 361/688, 690, 691, 695, 699; 323/236, 907; 310/68 B, 68 C, 68 D; 318/471, 472, 473; 257/712, 713, 721; 165/80.3, 275, 278, 279, 287, 293, 295

[56] References Cited

U.S. PATENT DOCUMENTS

| | | | |
|---|---|---|---|
| 4,117,527 | 9/1978 | Demarest et al. | 361/103 |
| 5,168,439 | 12/1992 | Kumar et al. | 363/95 |
| 5,237,338 | 8/1993 | Stephenson | 346/76 PH |
| 5,253,613 | 10/1993 | Bailey et al. | 105/49 X |
| 5,446,362 | 8/1995 | Vanek et al. | 318/801 |
| 5,491,610 | 2/1996 | Mok et al. | 361/695 |
| 5,497,288 | 3/1996 | Otis et al. | 361/695 X |
| 5,600,575 | 2/1997 | Anticole | 364/557 |

*Primary Examiner*—James P. Trammell
*Assistant Examiner*—Edward J. Pipala
*Attorney, Agent, or Firm*—Jill M. Breedlove; Marvin Snyder

[57] ABSTRACT

A method for providing thermal protection for forced air cooled power electronic semiconductors without direct measurement of semiconductor temperature, the semiconductors being mounted on a heat sink over which cooling air is blown includes the steps of computing the cooling air mass flow rate, creating an electronic model of the semiconductor/heat sink combination and estimating the semiconductor junction temperature from the mass flow rate and model. The cooling mass flow rate is determined by measuring the temperature of the cooling air prior to passage over the heat sink, measuring atmospheric pressure of the cooling air, determining the volumetric air flow rate of the cooling air and computing, from the cooling air temperature, pressure and volumetric flow rate, the cooling air mass flow rate. Power dissipation in the semiconductors is then computed and heat sink and semiconductor temperatures are estimated from power dissipation and cooling air mass flow rate. Semiconductor power dissipation is limited so as to restrict semiconductor temperature to a safe operating value.

5 Claims, 13 Drawing Sheets

THERMAL PROTECTION OF TRACTION INVERTERS

This invention relates to semiconductor electric power switching circuits and, more particularly, to a method and apparatus for determining thermal operating conditions of semiconductor devices in such circuits.

BACKGROUND OF THE INVENTION

Traction vehicles such as, for example, locomotives, employ electric traction motors for driving wheels of the vehicles. In some of these vehicles, the motors are alternating current (AC) motors whose speed and power are controlled by varying the frequency and current of AC electric power supplied to the motors. Commonly, the electric power is supplied at some point in the vehicle system as direct current power and is thereafter inverted to AC power of controlled frequency and amplitude. The electric power may be derived from an on-board alternator driven by an internal combustion engine or may be obtained from a wayside power source such as a third rail or overhead catenary.

Typically, the power is inverted in a solid-state inverter incorporating a plurality of semiconductor devices such as diodes and gate turn-off thyristors (GTO). In a locomotive, large off-highway vehicle or transit application, the traction motors may develop 1000 horsepower per motor thus requiring very highpower handling capability by the associated inverter. This, in turn, requires semiconductor switching devices capable of controlling such high power and of dissipating significant heat developed in the semiconductor devices due to internal resistance.

In conventional systems the semiconductor devices are mounted on heat transfer devices such as heat sinks which aid in transferring heat away from the semiconductor devices and thus preventing thermal failure of the devices. For these very high power semiconductors it is desirable to use heat sinks having generally hollow interiors through which cooling air can be forced to remove accumulated heat. Each heat sink is mounted to an air plenum and cooling air is blown through the heat sinks and into the electrical circuit area in which the semiconductors are located. The electrical circuit area may include the various control and timing circuits, including voluminous low power semiconductors, used in controlling switching of the power semiconductors.

In locomotive applications the cooling air is typically derived from blowers drawing air from overhead of the locomotive. The incoming air usually contains contaminants including diesel fumes and dust. A spin filter or inertial filter is used to at least partially clean this cooling air.

An inverter for large AC motor applications typically includes six high power semiconductor devices, such as gate turn-off thyristors (GTO's), requiring heat sinks and forced air cooling. These devices are generally press packs which require double side cooling for these high power applications. A common arrangement requires twelve heat sinks per inverter. On a six axle locomotive, the inverters alone will include 72 heat sinks requiring cooling air. This number of heat sinks requires a high volume flow of cooling air with a concomitant increase in filter capacity.

The semiconductor cooling system described above is essentially a forced air convection cooled design. In general, inverter designers take full advantage of the available cooling air in order to minimize the cost of the semiconductor devices, i.e., the inverter circuits are so designed that the semiconductor devices operate at their maximum temperature margin relying on forced air cooling to maintain operating temperature within design limits. In any situation in which the available cooling air is restricted, there is the possibility of the temperature of the semiconductor devices exceeding the design limit. For example, various operating conditions such as may occur during operation of a locomotive in a long tunnel, operation at low speeds such as at startup when high power is required, or operation when one motor is disabled and the remaining motors are required to carry extra loading all present a particular problem in maintaining nominal junction temperature. During tunnel transit of a locomotive consist, trailing units may ingest higher temperature exhaust fumes from leading units within the confines of the tunnels causing the heat sink temperatures to rise above that nominally experienced during normal ambient operation. Accordingly, there is a need to know the heat sink and semiconductor device temperature to assure that the devices are not operated at a power level which causes the devices to exceed their design temperature limits. In addition, there are modes of operation of a locomotive in which equipment ventilation, i.e., the forced air convection cooling, is not available because the locomotive's diesel engine is not operating. One such mode of operation is referred to as a "battery jog" mode in which at least one of the traction inverters is operated from the locomotive battery to propel the locomotive at low speeds within a service shop. Another mode in which diesel engine power is not available for providing forced air cooling is during cranking of the diesel engine in which one of the traction inverters is configured to rotate the engine using the traction alternator as a motor powered from the locomotive battery. In either of these modes, it is desirable to know the temperature of the semiconductor devices in the inverter to assure that the devices do not overheat during such modes of operation.

The semiconductor electric power switching circuits such as pulse width modulation (PWM) converter circuits and direct current (DC) to alternating current (AC) inverter circuits discussed above typically employ gate turn-off (GTO) thyristors since the GTO requires only a relatively simple drive circuit for gating the GTO device into and out of conduction. In the illustrated application, such as in locomotive motor drive circuits, the GTO device may carry several hundred amperes current and be required to operate with applied voltages of several hundred volts. It is desirable to know the temperature of the device since excessive temperature may degrade the ability of the GTO device to function properly.

In some prior art systems, semiconductor temperature monitoring utilizes signals generated by temperature sensors physically positioned adjacent the switching devices. In an illustrative relatively high voltage motor drive system, temperature monitoring has been achieved by a heat sensitive element, such as a thermistor, coupled in heat exchange relationship with the GTO device or to a heat sink on which the GTO device is mounted. Data obtained from the thermistor is transferred to a control unit through separate channels. In a single inverter using six GTO devices, it is common to monitor each device thus requiring six separate channels for data transmission. Each such channel requires separate wiring and its own electrical circuit hardware for supplying such data. In a locomotive power system having six driven wheel-axle sets each powered by a separate motor and inverter, 36 separate channels are required for monitoring temperature of the inverter thyristors. It is therefore desirable to provide a method and apparatus for monitoring such GTO devices in a manner which reduces the wiring and hardware requirements.

SUMMARY OF THE INVENTION

The present invention implements the above and other desirable features in an improved monitoring system for an electrical power control system of electrical semiconductor switching devices operable in electrically conductive and non-conductive states in response to command signals from a system controller. The inventive system computes the junction temperature of the semiconductor devices based upon available cooling air, calculated power dissipation in the semiconductor devices (both switching devices and diodes) based on voltage and current measurements and estimated heat sink temperature.

The system controller includes means for monitoring voltage and current, means for measuring the temperature of the cooling air supplied to the heat sinks of the semiconductor devices, means for measuring the atmospheric pressure of the cooling air, means for determining the volumetric air flow rate of the cooling air and computing from the cooling air temperature, pressure and volumetric flow rate, the cooling air mass flow rate. The system further includes means for calculating the power dissipated in the semiconductor devices and for estimating heat sink and semiconductor junction temperatures from the calculated power dissipation and computed cooling air mass flow rate. Finally, the system includes means for limiting the semiconductor power dissipation so as to restrict semiconductor junction temperature to a safe operating value. Still further, the system may include means for controlling the volumetric air flow rate to regulate temperature of the semiconductor devices up to the maximum cooling range of the cooling air. In one form, the process of calculating the power dissipation in the semiconductor devices includes measuring the voltage applied to the devices and the voltage and current at an output of the devices and determining from the measured voltages and currents the power dissipated in the devices. Estimation of the heat sink and semiconductor temperatures is accomplished in one form by creating an electronic model simulating the thermal characteristics of the heat sink and semiconductor devices and computing semiconductor junction temperature from the model based on computed power dissipation and cooling air mass flow rate. The control system in one form computes cooling air mass flow rate by measuring cooling air flow rate at a fixed blower speed and computing cooling air flow rate at other blower speeds in direct proportion to the flow rate of the fixed speed. The system also computes standard air mass flow rate and then calculates the actual air mass flow rate from the standard air mass flow rate by adjusting for atmospheric pressure and temperature.

BRIEF DESCRIPTION OF THE DRAWINGS

For a better understanding of the present invention, reference may be had to the following detailed description taken in conjunction with the accompanying drawings in which.

DETAILED DESCRIPTION OF THE DRAWINGS

Figure 1:
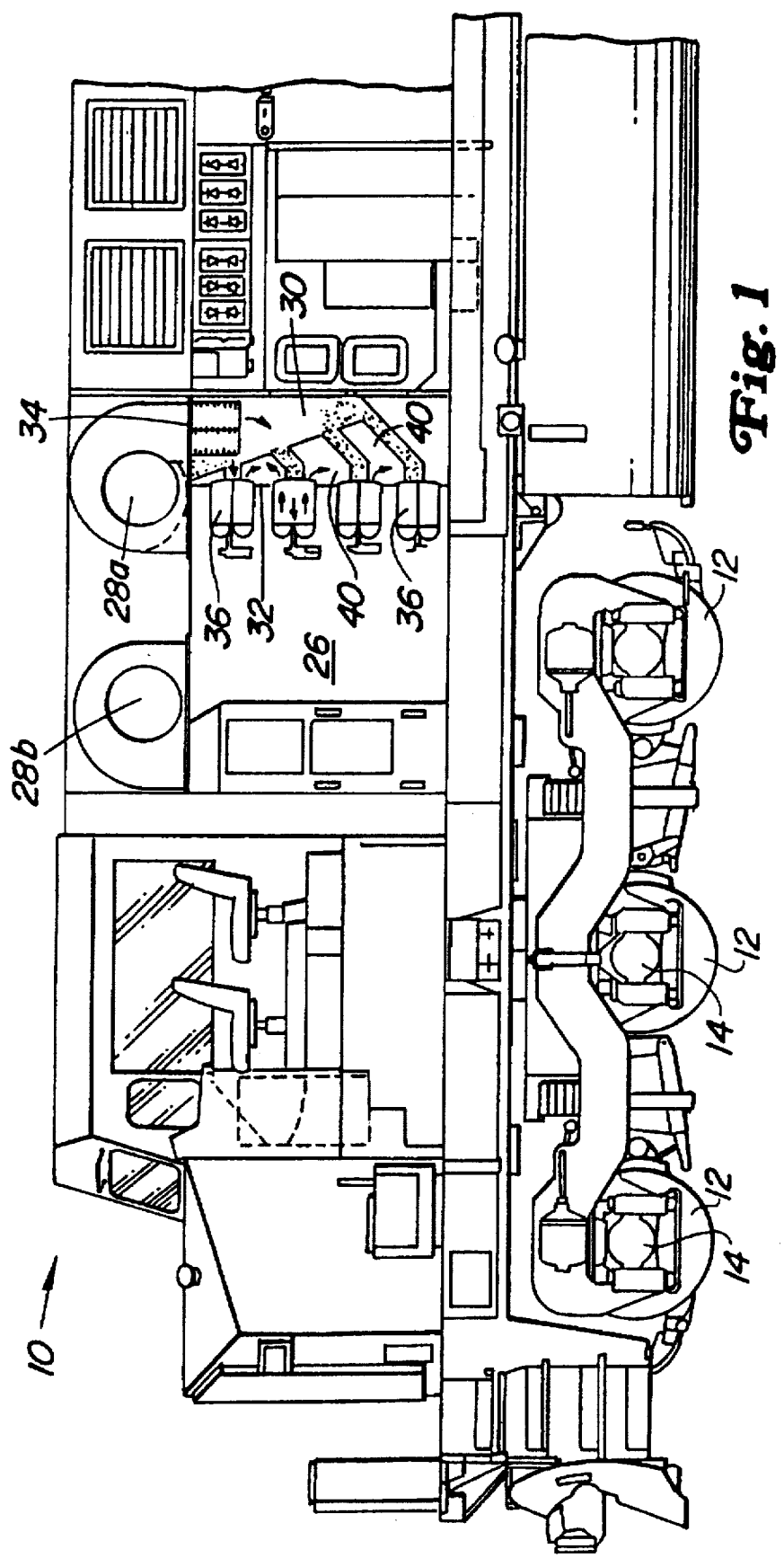
FIG. 1 is a simplified, partial schematic representation of a locomotive employing the teaching of the present invention.

Referring to FIG. 1 there is shown a simplified, partial cross-sectional view of an electric traction vehicle 10 illustrated as a locomotive, with which the present invention may be used. The locomotive 10 includes a plurality of traction motors, not visible in the figure but located behind the drive wheels 12 and coupled in driving relationship to axles 14. The motors are preferably alternating current (AC) electric motors and the locomotive includes a plurality of electrical inverter circuits for controlling electrical power to the motors. Of course this invention can be utilized in any semiconductor power converter that is force air cooled. It can be efficiently applied to other types of vehicles or typical industrial drives.

Figure 2:
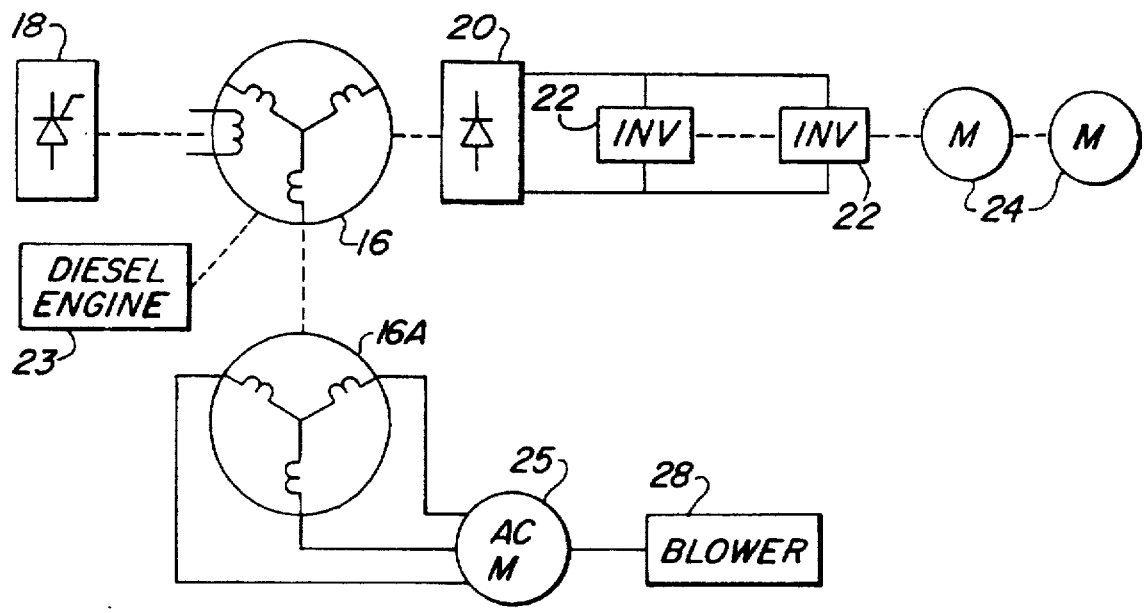
FIG. 2 is a simplified schematic representation of a power circuit for a traction vehicle.

Turning briefly to FIG. 2, a simplified schematic representation of the electrical power system for locomotive 10 includes an alternator 16 driven by an on-board internal combustion engine such as a diesel engine 23. Power output of the alternator 16 is regulated in a well known manner by field excitation control indicated by block 18. Electrical power from alternator 16 is rectified, block 20, and coupled to inverters 22. Inverters 22 convert the rectified power to variable frequency, variable amplitude power for application to AC motors 24.

Alternator 16 also includes an auxiliary winding set 16A which provides AC power to an induction motor 25 for driving a blower 28. The alternator 16 is a synchronous machine and its rotor may be directly coupled to an output shaft of engine 23. Variation in engine speed will directly effect the speed of blower 28.

Referring again to FIG. 1, electrical power circuits are at least partially located in equipment compartment 26. The control electronics for the inverters 22 and field control 18 as well as other electronic components are packaged in a conventional manner on circuit boards held in racks in compartment 26. Mounted above compartment 26 are a pair of blowers 28A, 28B which draw air from above the locomotive and blow it onto selected equipment requiring forced air cooling. Blower 28A blows air downward into distribution zone or plenum 30. One side of plenum 30 is defined by electrical equipment wall 32, generally vertically oriented, and which separates compartment 26 from plenum 30. The wall 32 is provided with a plurality of predeterminately arranged apertures for passing cooling air between the plenum 30 and compartment 26. The air from blower 28A is passed through a spin or inertial filter 34 as it enters plenum 30.

Within compartment 26, the high power electrical semiconductor devices are mounted to air cooled heat sinks 36. The heat sinks 36 are attached in cantilever fashion to equipment wall 32. The heat sinks 36 are of the type that are generally hollow, having a plurality of fins extending between opposite side walls defining longitudinally extending air passages from end-to-end. The heat sinks 36 are arranged in pairs in the illustrative embodiment with distal ends of each pair being coupled together by an air conduit 38 (See FIG. 3). At wall 32, the heat sink ends are sealingly mounted to preselected ones of the apertures extending through wall 32. On the plenum side of wall 32, selected ones of the apertures are connected to exhaust conduits 40 which extend outside the plenum 30. The arrangement is such that cooling air from plenum 30 flows into one end of one of a pair of heat sinks and exhausts through another end of the pair of heat sinks.

Figure 3:
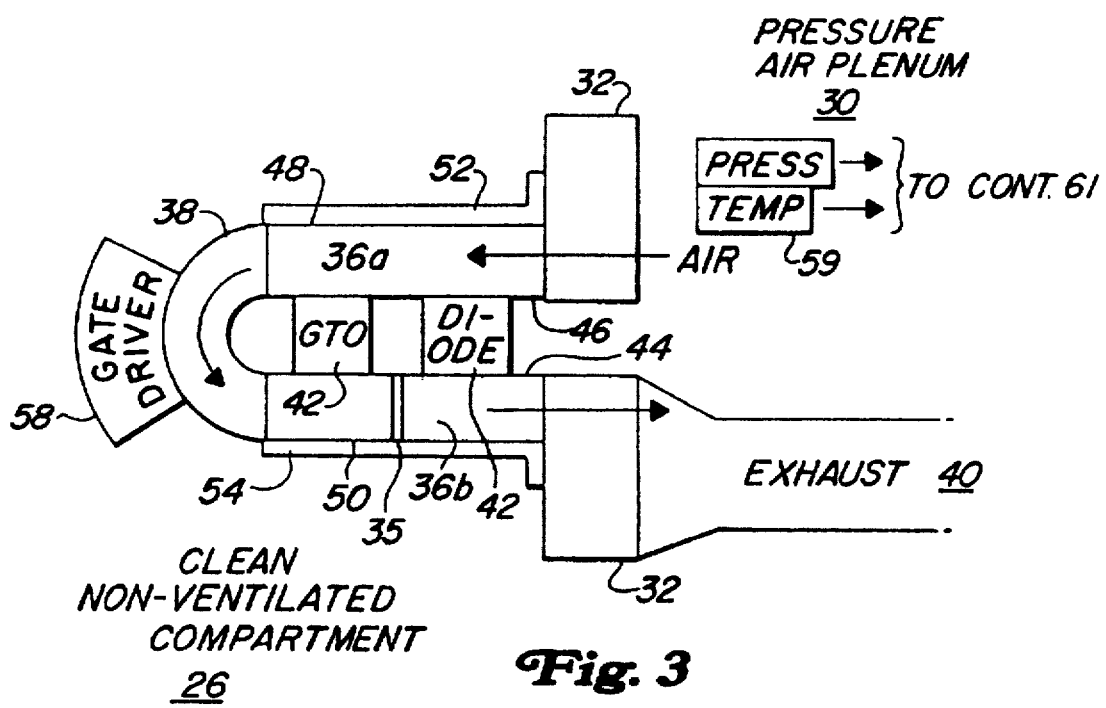
FIG. 3 is an enlarged, simplified representation of a system embodying the present invention.

FIG. 3 is an enlarged schematic representation of one of the pairs of heat sinks 36 in which a pair of semiconductor devices 42, illustrated as a diode and a GTO, are compressively mounted between opposing faces 44, 46 of the heat sinks. The devices 42 are typically press-pack packaged and clamping apparatus (not shown) is provided to compress the heat sinks 36 toward each other with a predetermined compressive force. Various forms of clamping for this type of device mounting is well known in the art. In the illustrative cantilever mounting, the outer surfaces 48, 50 of the pair of heat sinks may be attached to or comprise structural supports 52, 54 which may be bolted to wall 32 for sealingly compressing the ends of the heat sinks 36 over apertures in wall 32. The lower heat sink segment is split into two sections at a joint 35 and a suitable gasket inserted to prevent air leakage. The joint 35 allows the section coupled to the diode to be adjusted with respect to the section coupled to the GTO to accommodate slight differences in press-pack thickness due to manufacturing tolerances. The U-shaped heat sink segment 38 may be bolted or otherwise fastened to the ends of the heat sinks 36 within compartment 26 for circulating cooling air between upper and lower heat sink segments 36a and 36b. A gate driver module 58 is coupled in thermal association with segment 38 and heat from module 58 is transferred to segment 38 and the cooling air in the heat sink. Conventional air pressure and air temperature devices 59 provide signals to a system controller 61 (see FIG. 4) representative of air temperature and pressure.

As is shown, air from plenum 30 is forced through a first heat sink 36A, passes through conduit 38 and then through heat sink 36B, exiting through exhaust conduit 40. All of the electrical connections for the power system, including the power semiconductors devices 42, may be made within the compartment 26 and attached to the wall 32. However, the cooling air is contained within the heat sinks 36. By using the serially connected heat sinks 36, the air can be applied first to the anode terminal of the GTO devices, which terminal transfers more heat and requires more cooling, and thereafter applied to the GTO cathode terminal and one terminal of the diode. The heat sinks 36 may be electrically isolated by various known means. The heat sink segment 38 is either formed of an electrically non-conductive material or electrically isolated from segments 36a and 36b.

Figure 4:
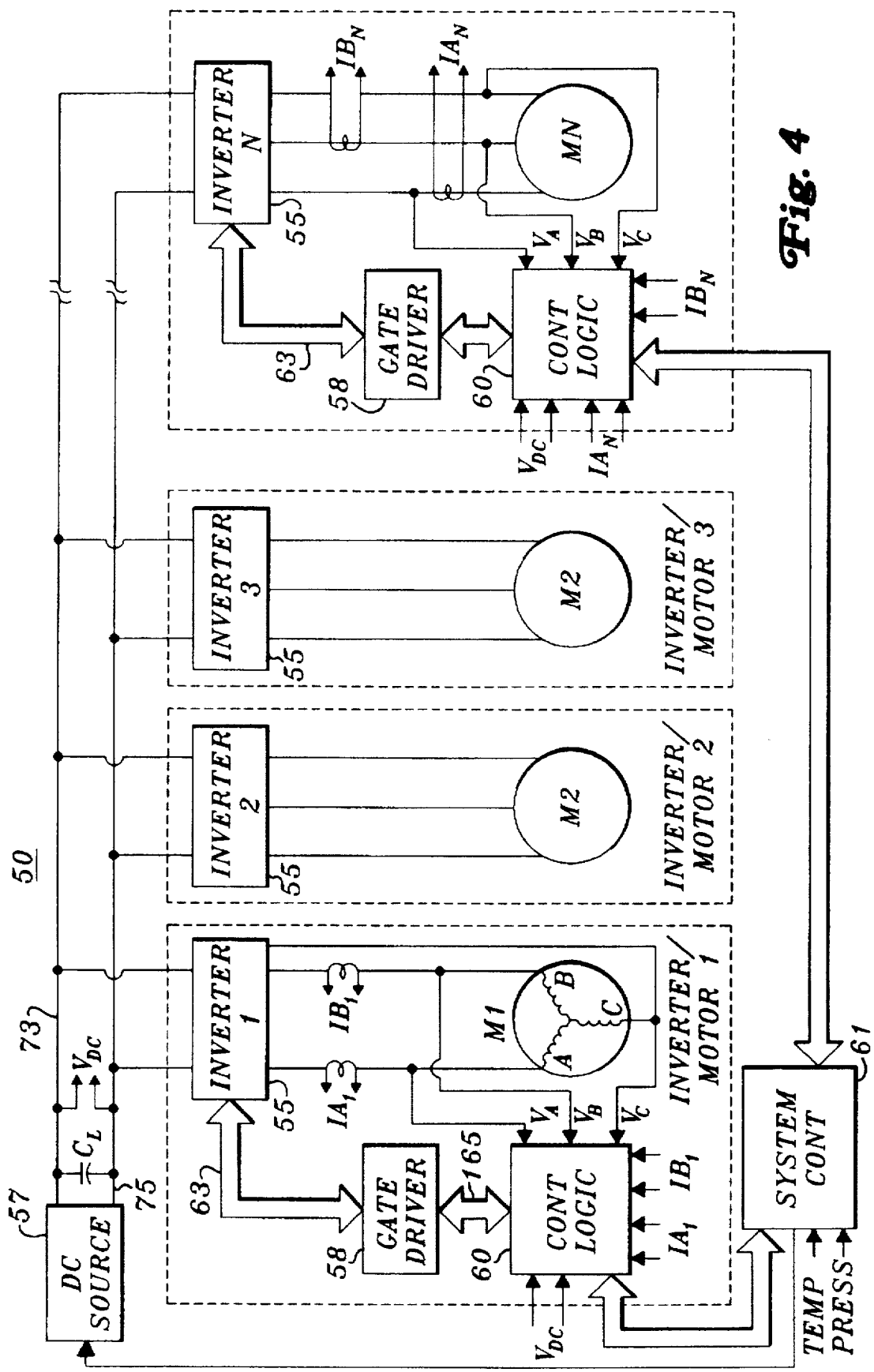
FIG. 4 is a generalized block diagram illustrating an AC motor drive system.
Figure 5:
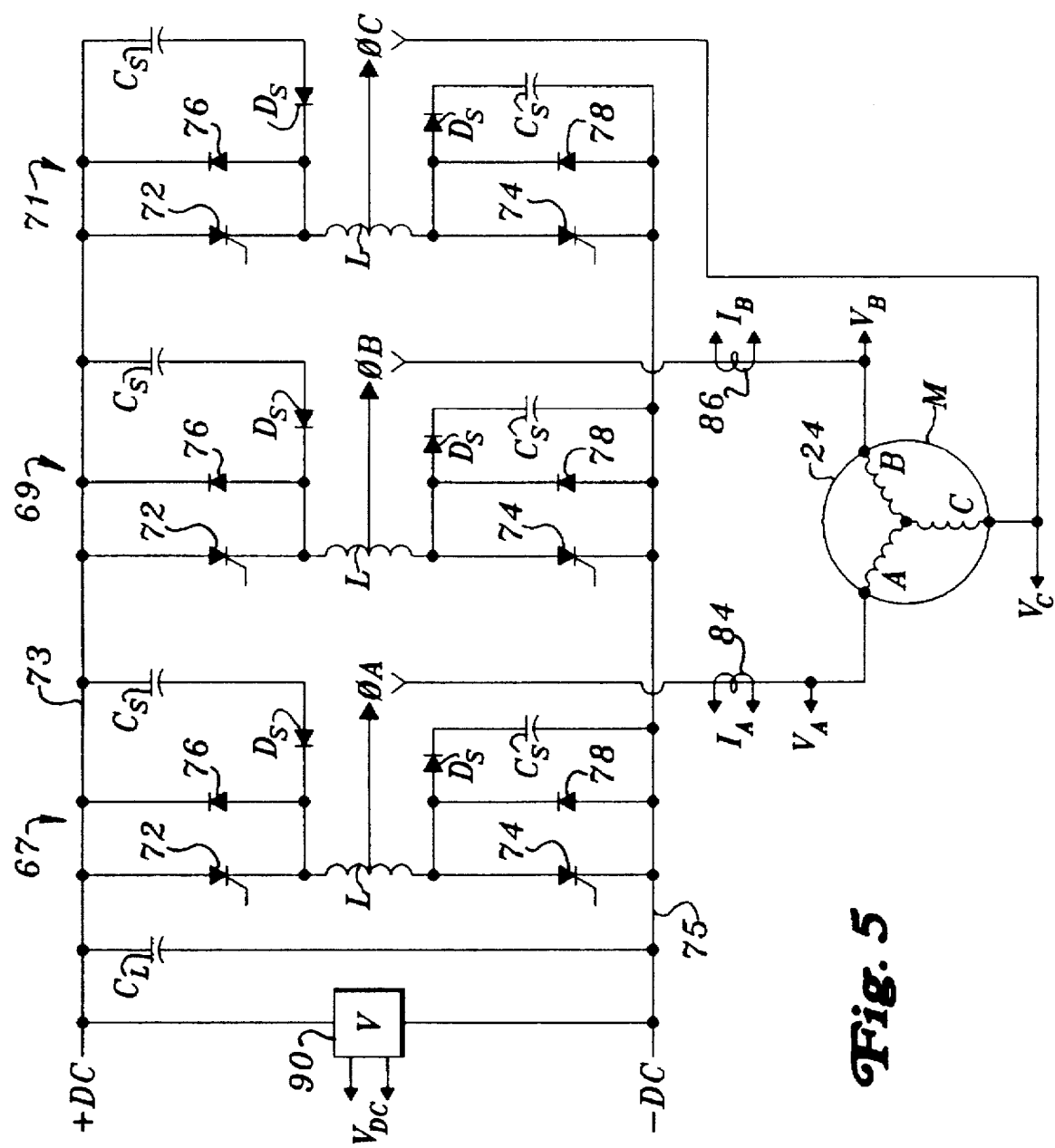
FIG. 5 is a detailed block diagram of the power inverter circuit shown in FIG. 4.

Before turning to the implementation of the present invention, reference is now made to FIGS. 4 and 5 which are schematic representations of inverter power circuits of the type which include the semiconductor devices mounted in the heat sink arrangements of FIGS. 1 and 3.

FIG. 4 is a block diagram of a specific embodiment of a three-phase, voltage source inverter driven motor system 50 of a type used in a locomotive propulsion system with which the present invention may be used. System 50 is illustrated as including a plurality of three-phase AC motors M1–MN (corresponding to motors 24) driven by a corresponding one of a plurality of three-phase voltage source inverters 55 (corresponding to inverters 22) supplied by a DC power source 57 (corresponding to alternator rectifier devices 16, 18, 20). It will be recognized that the invention is applicable to a wide range of power converter-load configurations, such as, for example, transformer loads and other inductive or resistive loads. Coupled to each inverter 55 is a corresponding one of a plurality of gate driver modules 58, each of which is controlled by a respective control logic circuit 60. In operation, the inverters 55 convert the DC power from DC source 57 into three-phase excitation voltage for application to respective phase windings A, B and C of motors M in response to gate drive signals from gate driver modules 58. The gate driver modules 58 provide gating signals over link 63 to enable switching of the inverter switching devices (e.g., GTOs) in the inverters 55. Each of the modules 58 are controlled by the respective control logic circuit 60 via optical control links 65. In addition, feedback status signals from the GTO devices of each inverter 55 are coupled back to the associated gate driver module 58 and its control logic circuit 60 via the links 63 and 65. Additional signals from current ($I_A$, $I_B$) and voltage ($V_A$, $V_B$, and $V_C$) sensors at the inverters 55 outputs are coupled to each control logic circuit 60 as shown. The control logic circuits 60 use the sensed current and voltage values in the calculation of power dissipation in the semiconductor circuits, among other functions. The system controller 61 provides signals to logic circuits 60 to enable operation of the inverters.

Referring now to FIG. 5, there is shown a simplified schematic diagram of one of the three-phase inverters 55. A more detailed illustration of an embodiment of inverters 55 and their associated gate driver circuits 58 is set forth in U.S. Pat. Nos. 5,262,691 and 5,363,039, both assigned to General Electric Co. The inverter 55 comprises a first leg 67 (phase A), a second leg 69 (phase B), and a third leg 71 (Phase C), each having an upper GTO 72 and a lower GTO 74 arranged in series with the anode of the upper GTO 72 coupled to a positive DC source bus 73 and the cathode of the lower GTO 74 coupled to a negative DC source bus 75.

For each GTO 72, 74, there is a respective anti-parallel diode 76, 78 connected from anode to cathode to provide a return path for inductive load currents. Each GTO is also shunted by a snubber circuit comprising a capacitor Cs and a diode Ds which assists in reducing switching transients although the snubber circuits may not be mounted to the heat sinks. A split inductor L also functions as part of the snubber circuit with the inverter phase output being developed at a center top of the inductor. Current measurement circuit 84 and 86, each of which may be a Model LT1000-FI/SP45 manufactured by LEM of Switzerland, are connected to monitor current at the inverter output. Since net current $I_A + I_B + I_C$ equals zero, one phase current can be calculated from measured values of two of the phases. Each output phase is coupled to a corresponding phase terminal of one of the three-phase motor 24. A conventional high impedance voltage measurement circuit 90 is connected between the DC busses 73 and 75. The current measurement circuits 84 and 86 generate current measurement signals $I_A$ and $I_B$ which are coupled to the control logic circuit 60. The voltage measurement circuit 90 generates a voltage measurement signal $V_{DC}$ which is coupled to the control logic circuit 60. Additionally, the phase voltages $V_A$, $V_B$, $V_C$ with respect to neutral are monitored by circuit 60. The GTO/diode pairs 72, 76 and 74, 78 each correspond to the GTO and diode pairs shown in FIG. 3.

Each gate driver circuit 58 is coupled to the gate and cathode of each respective GTO 72, 74 and provide drive signals to the gates of the GTOs to turn them on and off at the proper time. The gate drivers also detect whether the GTO actually did turn on or off in response to the drive signals (i.e., gate status feedback). In addition, each gate driver 58 is coupled to an associated control logic circuit 60 via conventional optical couplers to permit input of gate command signals from the control logic circuit 60 and to send gate status feedback signals, indicating whether the GTO is turned on or off, back to the control logic circuit 60.

A detailed description of an exemplary control logic circuit 60 is provided in U.S. Pat. No. 5,168,439 entitled "Inverter Control Method and Apparatus" issued Dec. 1, 1992 and assigned to General Electric Company. The operation of logic circuit 60 in conjunction with inverter 54 and gate driver 58 is set forth in the aforementioned U.S. Pat. No. 5,363,039.

In normal operation, the control logic circuit 60 generates gate command signals which are coupled to the gate driver module 58. A microprocessor controls generation of gate firing pulses by providing gate firing control signals. The gate driver module 58 generates gate firing control pulses in response to the gate firing control signals. The GTOs of each inverter 55 are then turned on and off by the gate driver module 58 at the appropriate times under the control of the gate firing pulses (gating signals). Additionally, gate status feedback signals are coupled to the logic circuit 60 which utilizes them to determine if the GTOs actually switched, as commanded, in order to prevent unwanted conditions such as having both upper and lower GTOs turned on at the same time.

The present invention provides an improved method of inverter thermal protection which eliminates the need for separate heat sink thermistors and temperature conversion circuitry mounted on the semiconductor device heat sinks and relies instead on real time calculation of semiconductor junction temperature based on readily available propulsion and inverter system variables as well as the physical characteristics of the power semiconductors and their heat sinks. Furthermore, the present invention overcomes a deficiency in the prior art in which thermistors were mounted to the heat sinks to determine semiconductor junction temperature, namely that the semiconductor junction temperature can vary as much as 30° F. from the heat sink temperature depending on the transient power dissipation in the device. In an illustrative form, the system is implemented on a per axle basis in which each of the locomotive's inverter motor controllers 60 receives from the system controller 61 a signal representing an equivalent per semiconductor group (GTO, diode and gate driver) volumetric air flow rate, the atmospheric pressure of the air and the cooling air temperature within the intake air plenum 30. Based on this data, each of the motor control logic circuits 60 computes the available inverter cooling air mass flow rate. Concurrently, the control logic 60 also computes the power dissipation within the semiconductor devices based on traction motor torque, stator frequency of the motor 24, peak fundamental current, DC link voltage, the inverter modulation index, switching frequency, and power semiconductor loss characteristics. The logic module 60 also conducts a heat sink and power semiconductor thermal simulation so that it is able to compute the semiconductor switch (GTO 72 or 74) and freewheel diode (diode 76 or 78) junction temperatures based on cooling air temperature, heat sink air mass flow, steady state sink thermal resistances as a function of air mass flow, steady state semiconductor thermal resistances, thermal capacities of the heat sinks and the semiconductor devices and then provides signals to adjust the motor 24 torque limit to provide for a smooth and controlled deration of the inverter power output if the calculation shows that the semiconductor junction temperatures may exceed design limits, i.e., the system anticipates a junction temperature rise and allows for adjustment of inverter operation to prevent an over temperature condition.

The calculation of cooling air mass flow is relatively straightforward and requires only two continuing measurements, i.e., ambient temperature and atmospheric pressure, during operation of the locomotive. The initial calculation of cooling air volumetric flow rate can be determined by measuring the flow rate at a selected engine speed and then adjusting the flow rate as a function of engine speed. For example, in the illustrative locomotive, the diesel engine 23 drives the traction alternator 16 which is a synchronous machine. The auxiliary winding 16A of the traction alternator supplies power to the alternator blower motor 25. The alternator blower motor is an induction motor coupled to an impeller or blower 28 for providing cooling air to the inverters through the inverter heat sinks. The frequency of the power developed by the traction alternator is a function of engine speed and the speed of the induction blower motor is a function of the frequency of power applied to the motor. Accordingly, the frequency of rotation of the impeller driven by the induction motor is a function of the speed of the diesel engine. Accordingly, by measuring the volumetric air flow rate at some selected speed, the actual air flow rate supplied to the locomotive inverter heat sinks at any other speed can be calculated since it will be directly proportional to diesel engine speed. For example, if the volumetric air flow rate is 150 cubic feet per minute at a diesel engine speed of 1000 rpm, the volumetric air flow rate at any other engine speed is calculated from the relation:

$$CFM = (\text{engine RPM}) \times (CFM \text{ at } 1000 \text{ RPM}) \text{ divided by } (1000 \text{ RPM}).$$

While the blower volumetric air flow rate is independent of environmental conditions, the heat sink air mass flow rate is a function of volumetric air flow rate, atmospheric pressure and cooling air temperature. Under a standard environmental condition of 70° F. at sea level, heat sink air mass flow rate is $$[(\text{Lbs/min}) \text{ standard}] = \{[(\text{cubic ft})/\text{min}] * \{0.075 \text{ Lbs}/[(\text{cubic ft})]\}.$$

For other conditions of temperature and elevation, actual or "site" heat sink air mass-flow rate is $$[(\text{Lbs/min}) \text{ site}] = [(\text{Lbs/min}) \text{ standard}]/(CF)$$

where CF is the "air density correction factor" given approximately as $CF = \{(0.0566613) * [T(\text{degrees F}) + 459.67]\}/(\text{pressure})$.

Figure 6:
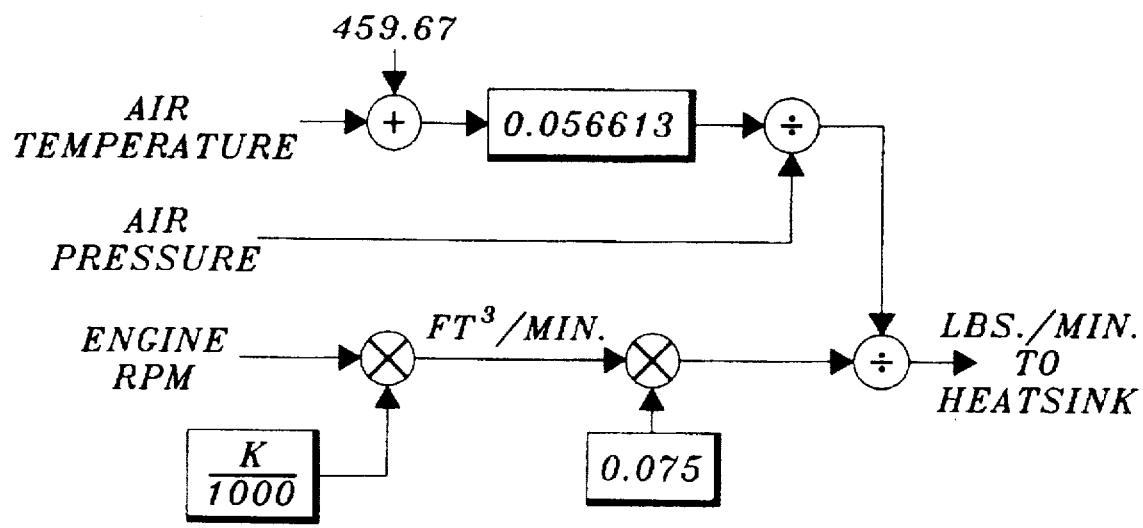
FIG. 6 is a functional block diagram illustrating calculation of heat sink air mass flow rate.

Referring now to FIG. 6, there is shown a schematic representation of the method described above for calculating heat sink mass flow rate. Note that an air density correction factor is calculated by taking ambient temperature in degrees Fahrenheit and adding it to 459.67 degrees to convert to a Rankine temperature. The Rankine temperature is then multiplied by a physical constant (0.0566613) and divided by atmospheric pressure to derive an air density correction factor. At the same time, the present diesel engine RPM is multiplied by the ratio of volumetric air flow rate at a selected RPM to arrive at a value for air flow rate at the present RPM. This number is then multiplied by another physical constant (0.075) and divided by the air density correction factor to arrive at the air mass flow rate to the heat sinks.

Figure 7:
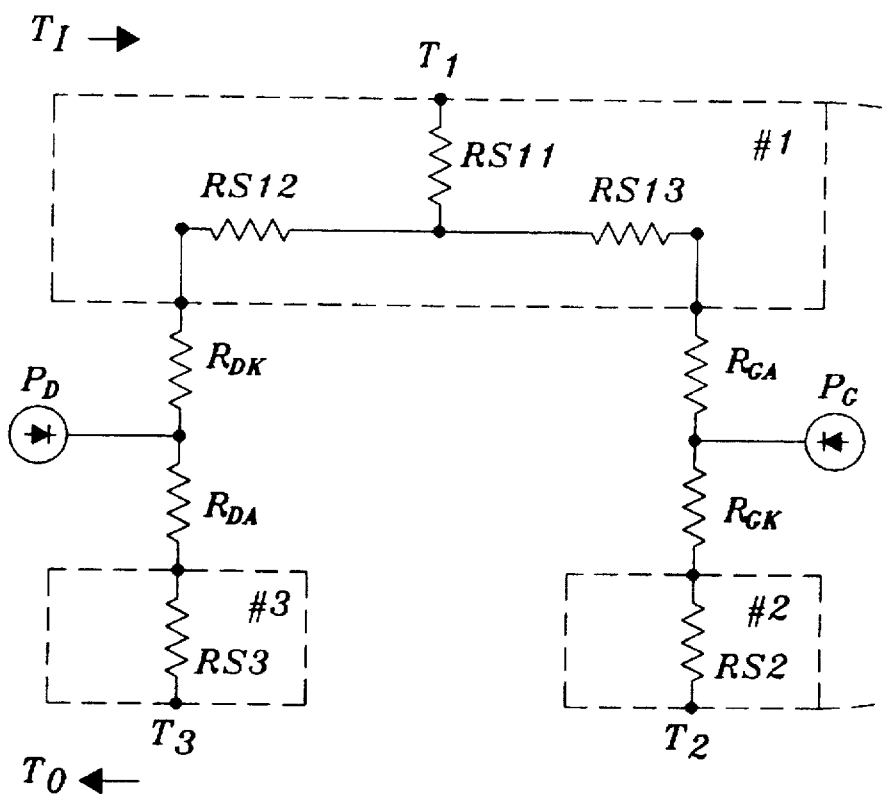
FIG. 7 is a simplified electrical equivalent circuit for the thermal characteristics of the semiconductor device heat sinks.

Turning now to FIG. 7, there is shown a simple physical representation of a single one of the semiconductor GTO devices and their associated diode and heat sinks, such as GTO device 72 and associated diode 76. The GTO device 72 may comprise a 60 millimeter junction diameter press pack GTO and the diode may comprise a 53 millimeter junction diameter press pack diode. As illustrated in FIG. 3, one of the heat sink sections 36a is common to both the GTO anode and the diode cathode while another heat sink section 36b is common to the GTO cathode and the diode anode. In FIG. 7, the heat sink section 36a common to the GTO anode and diode cathode is indicated as sink #1. Because there can be a difference due to manufacturing tolerances in GTO device and diode thickness, the lower section 36b of the heat sink assembly is divided into two portions. A first portion which is coupled to the GTO cathode is labeled as sink #2 while the second portion coupled to the diode anode is labeled as sink #3. The thermal model includes a first heat source $P_D$ which represents the power dissipation in the diode and a second heat source $P_G$ which represents the power dissipation in the GTO semiconductor switch. The resistance RDA represents the thermal resistance between the diode junction and heat sink #3 coupled to its anode. The resistance RGK represents the thermal resistance between the GTO junction and the heat sink #2 coupled to its cathode. The resistances RS3 and RS2 represent the thermal resistance, as a function of air mass flow for heat sink #3 and heat sink #2, respectively. The resistance RDK represents the thermal resistance between the diode junction and heat sink #1 while the resistance RGA represents the thermal resistance between the GTO anode junction and sink #1. The resistances RS12 and RS13 represent the thermal resistance between the diode and GTO through the heat sink #1 and are constant values based on physical properties. The resistance RS11 represents the thermal resistance across the heat sink to the cooling air at temperature T1 and depends on air mass flow and the values of RS12 and RS13. It should also be noted that due to the particular arrangement of the heat sinks as shown in FIG. 3, the cooling air at sink #2 may have a different temperature indicated as T2 than the cooling air passing over sink #3 with temperature T3. The arrow labeled as $T_I$ represents the temperature of the incoming air while the arrow labeled $T_O$ represents the temperature of the exhaust air circulating through the U-shaped heat sink (Sink 1+Sink 2+Sink 3 and gate driver).

Figure 8:
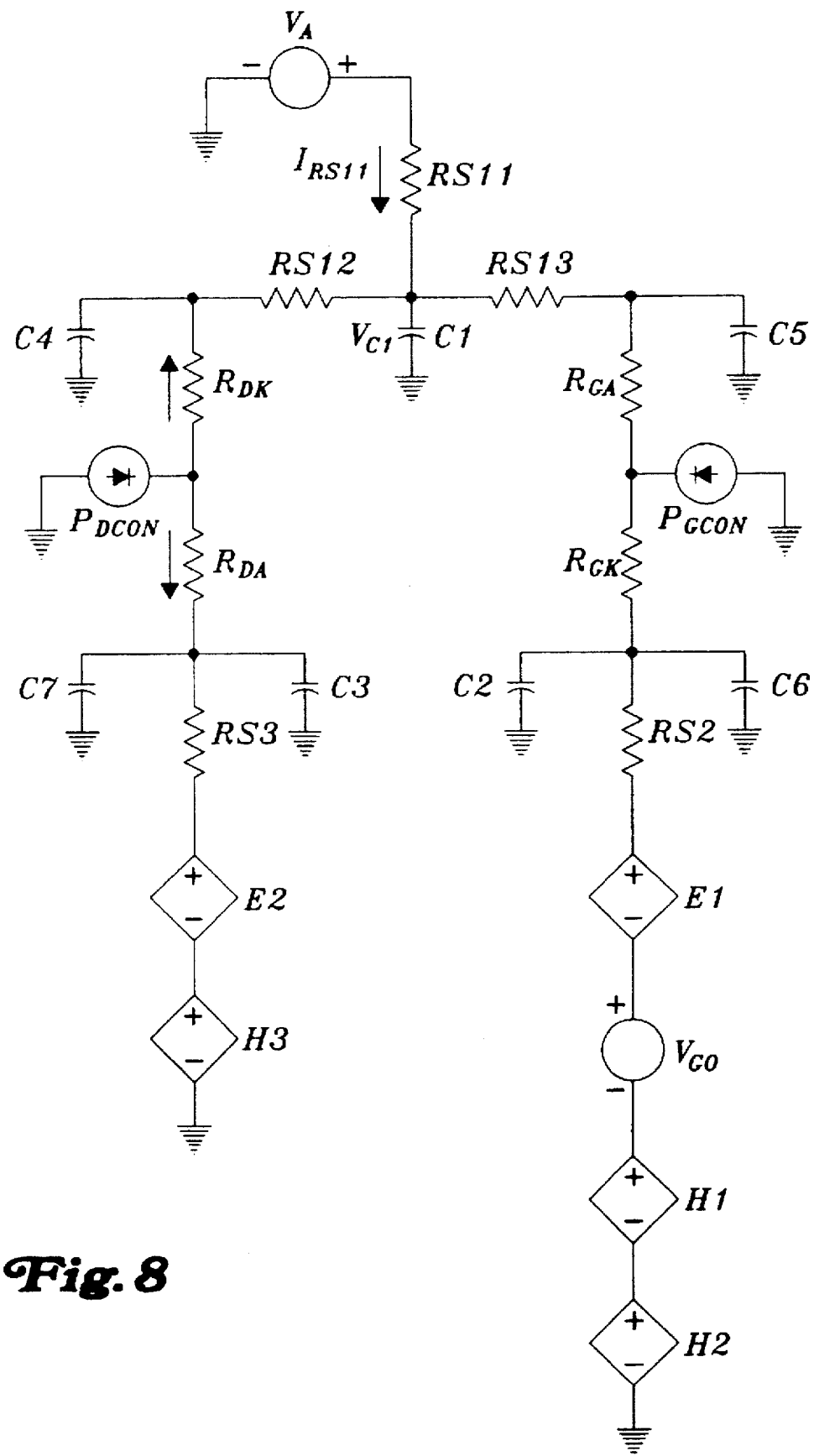
FIG. 8 is an electrical circuit approximation of the thermal model of FIG. 7 including the semiconductor devices.

FIG. 8 represents the conversion of the physical thermal model of FIG. 7 into a corresponding electrical model including capacitors representing the thermal capacity or heat storage mass of each of the heat sinks and semiconductors, resistances representing sink and semiconductor thermal resistances, voltage sources representing heat sink air temperatures, and current sources representing each semiconductors power dissipation. The voltage sources vary with changes in cooling air temperature and atmospheric pressure. The capacitors C1, C2 and C3 represent the thermal capacity or heat storage mass of the heat sinks #1, #2 and #3, respectively. The capacitors C4 and C7 each represent one-half the thermal capacity of the diode mass while the capacitors C5 and C6 each represent one-half the thermal capacity of the GTO mass. The voltage source $V_A$ represents the ambient temperature of the air entering the heat sink arrangement. The current sources ID and IG represent the power dissipation in the diode and GTO thyristor, respectively.

While heat sink #1 is exposed directly to the incoming blower air at temperature $T_I$, represented by voltage source $V_A$, the temperature of the air blowing over the heat sink #2 is higher than that on heat sink #1. The block E1 represents a voltage proportional to the ambient temperature or one times $V_A$. Coupled to that is the block VGD which represents the heat added to the ambient air by the air blowing over the gate driver circuits 58 before circulating through heat sink #2. The block H1 represents the temperature rise in the cooling air due to the power dissipation through the diode cathode which is coupled to heat sink #1. The block H2 represents the temperature rise in the air due to power dissipated through the anode of the GT0 device and transferred into heat sink #1. Each of these blocks E1, VGD, H1 and H2 cause the air temperature blowing over heat sink #2 to be hotter than the air temperature blowing over heat sink #1. Accordingly, each block represents a voltage or temperature offset to heat sink #2.

Similarly, the air blowing over heat sink #3 has been raised in temperature by heat transferred through heat sink #1, through passage over the gate driver circuits and passage through heat sink #2. This increase in temperature is represented by the blocks E2 and H3. Block E2 represents each of the blocks E1, VGD and H1 coupled to heat sink #2. Block H3 represents the total heat transferred to the air through sink #1 and sink #2 of the GTO device. It will be recognized that the electrical equivalent circuit shown in FIG. 8 is only one embodiment of a possible electrical model of the thermal dissipation through the heat sinks in the inverter cooling system. However, applicants have found that this model provides an estimation of semiconductor device junction temperature which is substantially equal to the junction temperature obtained by direct measurement of heat sink temperatures and model for the semiconductors.

In creating the electrical model of FIG. 8, it is necessary to calculate semiconductor losses. Conduction losses can be calculated assuming current through the devices to be sinusoidal. While this assumption produces some error due to the fact that the voltage drop across the GTO is not constant but a function of current, since the ripple content is small and a variation in voltage drop due to ripple is even a smaller fraction, the effect of utilizing a sine wave assumption is negligible. However, one factor which does need to be considered is the amount of time the current actually flows through the GTO thyristor and its associated diode. This time will change due to power factor or the angle between the phase voltage with respect to DC negative and the output current. Conduction losses can be computed by converting instantaneous power dissipation (for both GTO device and diode) as a function of instantaneous current to power dissipation as a function of the angle between voltage and current for a modulation index of 1 (or square wave voltage).

Figure 9:
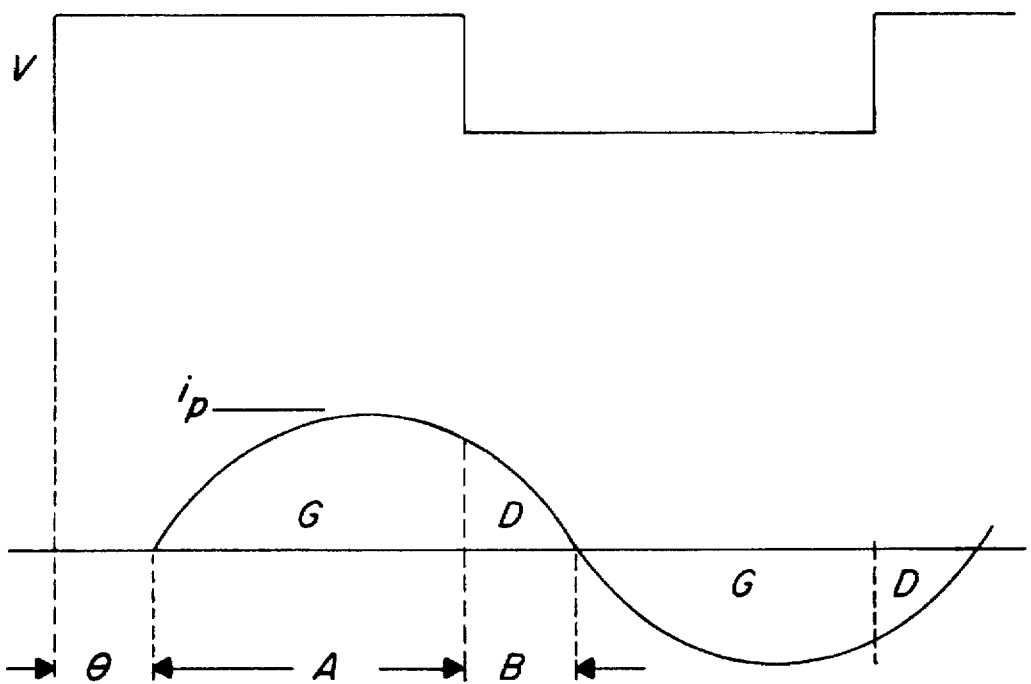
FIG. 9 illustrates current and voltage at the semiconductor devices.

Referring to FIG. 9, there is illustrated a phase voltage V (square wave operation) and phase current i where the current is assumed to be sinusoidal with an amplitude of $i_p$. The angle between the voltage and current is $\Theta$. Current i is lagging voltage by angle $\Theta$ from voltage V. The portions marked D and G are the portions when the current flows through the diode and GTO device. The objective is to obtain the loss in the semiconductors given the values of $i_p$ and $\Theta$. If one considers the region A where the current is flowing through the GTO device with amplitude $i_p$ and power loss $P_g$, $P_g$ can be obtained by integrating the instantaneous loss W, where W is the product of instantaneous current and instantaneous voltage over a short interval, e.g., one millisecond.

Figure 10:
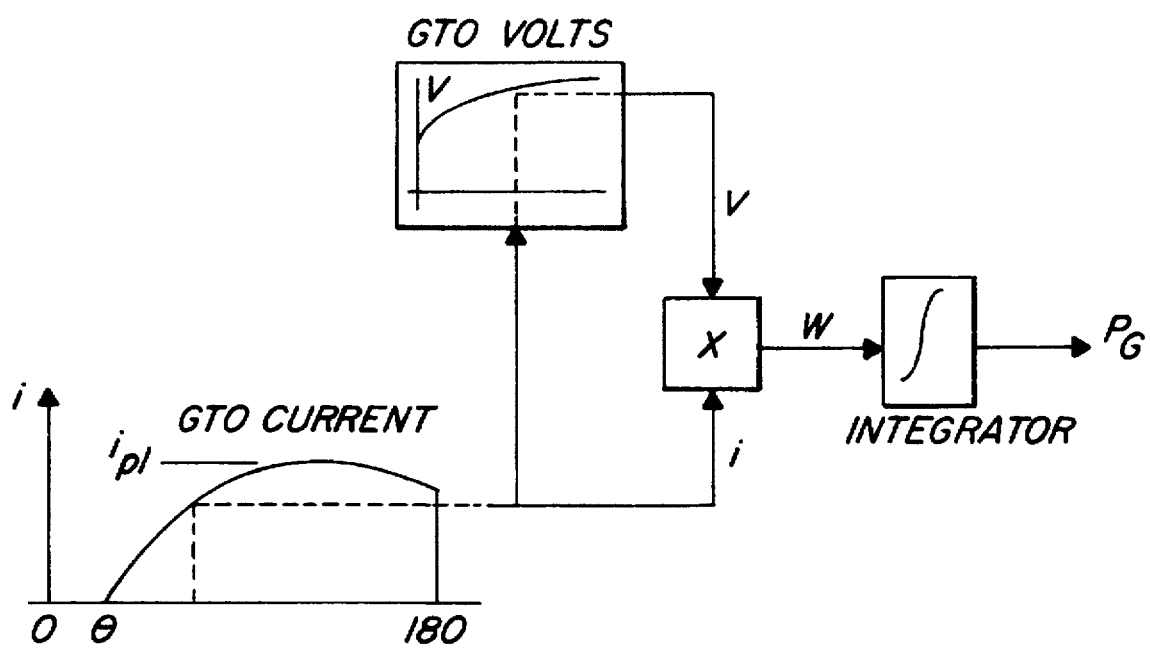
FIG. 10 illustrates instantaneous power loss calculation from instantaneous voltage and current.
Figure 11:
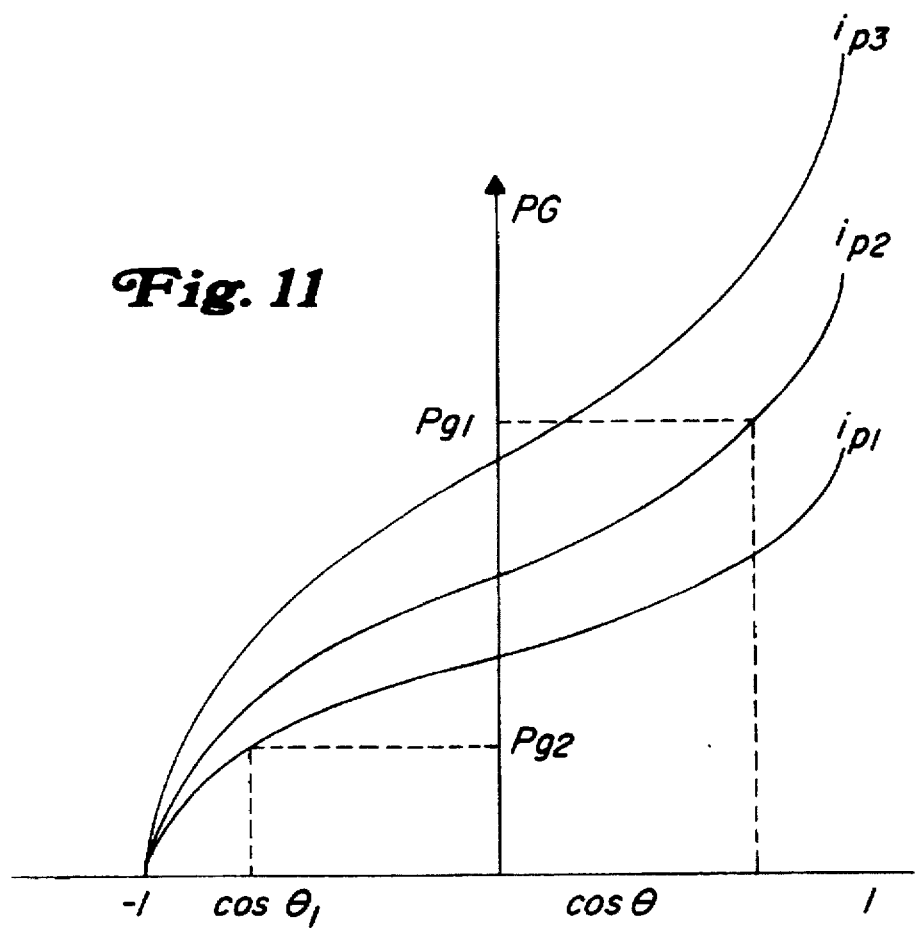
FIG. 11 illustrates semiconductor switch power dissipation as a function of power factor and peak current.

Referring now to FIG. 10, there is shown a portion of a sine wave in conjunction with a multiplier and integrator which enables calculation of instantaneous loss in watts W as the product of instantaneous current i through and instantaneous voltage V across the GTO. If the region A extending from angle $\Theta$ to 180° represents the area where current is flowing through the GTO device with an amplitude of $i_{p1}$, the instantaneous power loss in the GTO device due to this current is obtained by integrating the instantaneous loss as a product of instantaneous current and instantaneous voltage over a preselected period such as one second. This process can be repeated for various angles of $\Theta$ to get power dissipation as a function of cosine $\Theta$ or power factor. Such a calculation enables plotting of power dissipation for various values of peak current $i_p$ and power factor. FIG. 11 shows a family of curves for power dissipation in a GTO device as a function of cosine $\Theta$ and peak current $i_p$. It will be noted that the plots are symmetric with respect to a power factor of 0 or angle $\Theta$ equal to 90°. In FIG. 11, the value of $P_{g2}$ represents the loss in a GTO device if the current through the device has a shape as shown in region B of FIG. 9. Note that values of $P_g$ for intermediate values of $i_p$ can be obtained by interpolation between the plotted curves.

Figure 12:
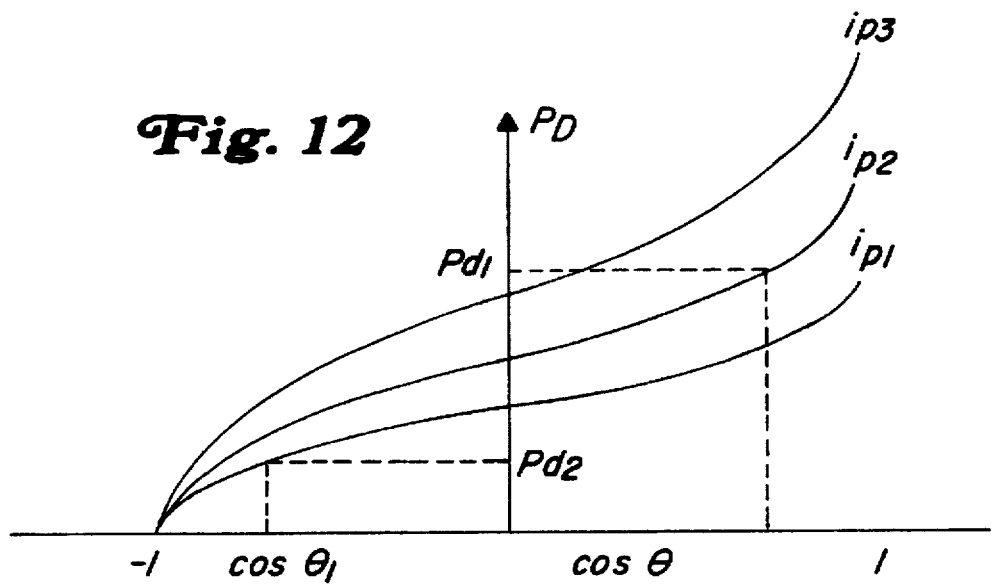
FIG. 12 illustrates semiconductor diode power dissipation as a function of power factor and peak current.

FIG. 12 illustrates the power dissipation in the inverter diode (76 or 78) for various peak currents $i_p$ and power factor (cos $\Theta$). The value $P_{d1}$ represents the dissipation in the diode if the current in region A in FIG. 9 had been flowing through the diode instead of the GTO device. $P_{d2}$ represents the dissipation loss in the diode if the current in the region B had been flowing through the diode instead of the GTO device. It will be noted that the difference between the curves in FIG. 11 and the curves in FIG. 12 differ only in the slope of the curve. From the curves of FIG. 11 and 12, it can be seen that the dissipation loss for sine wave current of an amplitude $i_{p1}$ and angle $\Theta_1$ will produce a GTO device dissipation of $P_{g1}$ and a diode dissipation loss of $P_{d2}$ for square wave operation.

Figure 13:
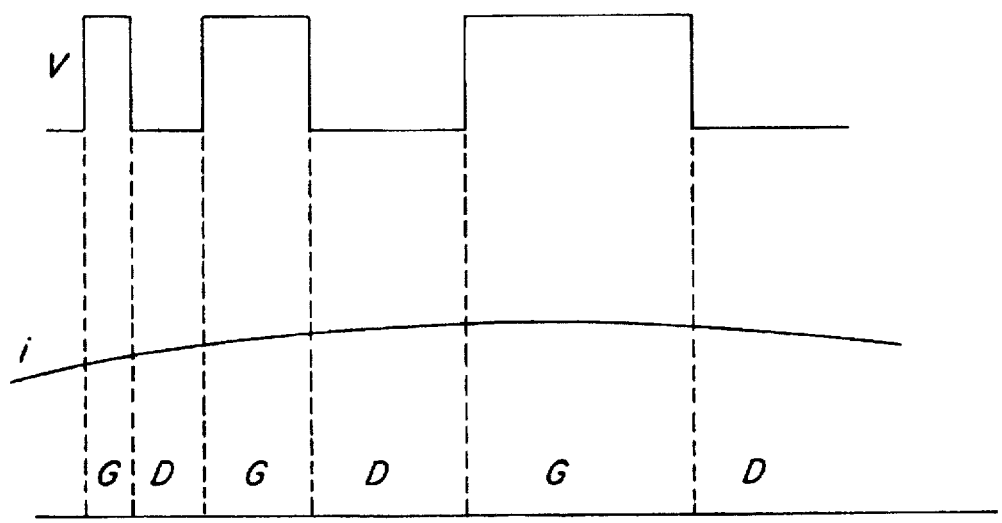
FIG. 13 illustrates waveforms for PWM operation of the semiconductor devices.

If the system is operated in a pulse width modulation (PWM) mode of operation rather than a square wave mode of operation, portions of the current in any of the segments A or B of FIG. 9 could flow through the GTO device or the diode. FIG. 13 illustrates a form of PWM operation. If a portion of the waveform section A during PWM operation is considered, the voltage waveforms assume the configuration illustrated by the sections G and D of FIG. 13. Section G indicates conduction of the GTO device while section D indicates a period in which the GTO device is not conducting. The width of any of these sections changes as a function of modulation index. If the modulation index is 0 (zero), the width of G and D sections are equal. If the modulation index is 1, the system operates in a square wave mode. During section A, the loss in the GTO device varies from 0.5 of $P_{g1}$ for a modulation index of 0 to $P_{g1}$ when the modulation index is 1. During the section B, the loss in the GTO device varies from 0.5 of $P_{g2}$ for a modulation index of 0 to 0 when the modulation index is 1. Accordingly, the GTO conduction dissipation loss can be approximated by the relationship:

$$P_{gcon}=[P_{g1}*(1+MI)*0.5]+[P_{g2}*(1-MI)*0.5]$$

Similarly for the diode the loss is given by $$P_{dcon}=[P_{d1}*(1-MI)*0.5]+[P_{d2}*(1+MI)*0.5]$$

Therefore the loss during square wave operation is obtained by substituting a value of 1 for the modulation index and the losses in the GTO and diode are given by $$P_{gs}=P_{g1}$$

$$P_{ds}=P_{d2}$$

Similarly, during very low speed operation of the motors with modulation index of 0 the losses in the GTO and diode are given by $$P_{g0}=(P_{g1}+P_{g2})*0.5$$

$$P_{d0}=(P_{d1}+P_{d2})*0.5$$

It may be noted that during zero output voltage operation the current flows through the GTO 50% of the time and through the diode 50% of the time and it is not a function of the power factor. Also, the losses $P_{g1}$, $P_{g2}$, $P_{d1}$ and $P_{d2}$ are symmetric with respect to $\Theta=90$ or $\cos\Theta=0$.

The power input ($P_s$) to the motor stator from each inverter is the sum of the electrical power into the motor air gap, motor core losses and the stator $i^2R$ losses. This can be given by $$P_s=1.5*i_p^2*R_s+k\,Tf$$

where $R_s$ is the stator resistance per phase, T is the electromagnetic torque, f is the stator frequency and k is to convert units to watts. The VA output ($P_v$) of the inverter is given by $$P_v=3\,V_{ac}I=3*V_{dc}*(\sqrt{2}/\Pi)*MI*(i_p/\sqrt{2})$$

where $V_{dc}$ is the dc link voltage. From $P_s$ and $P_v$, $\cos\Theta$ can be calculated by taking the ratio given by $$\cos\Theta=P_s/Pv$$

Figure 14:
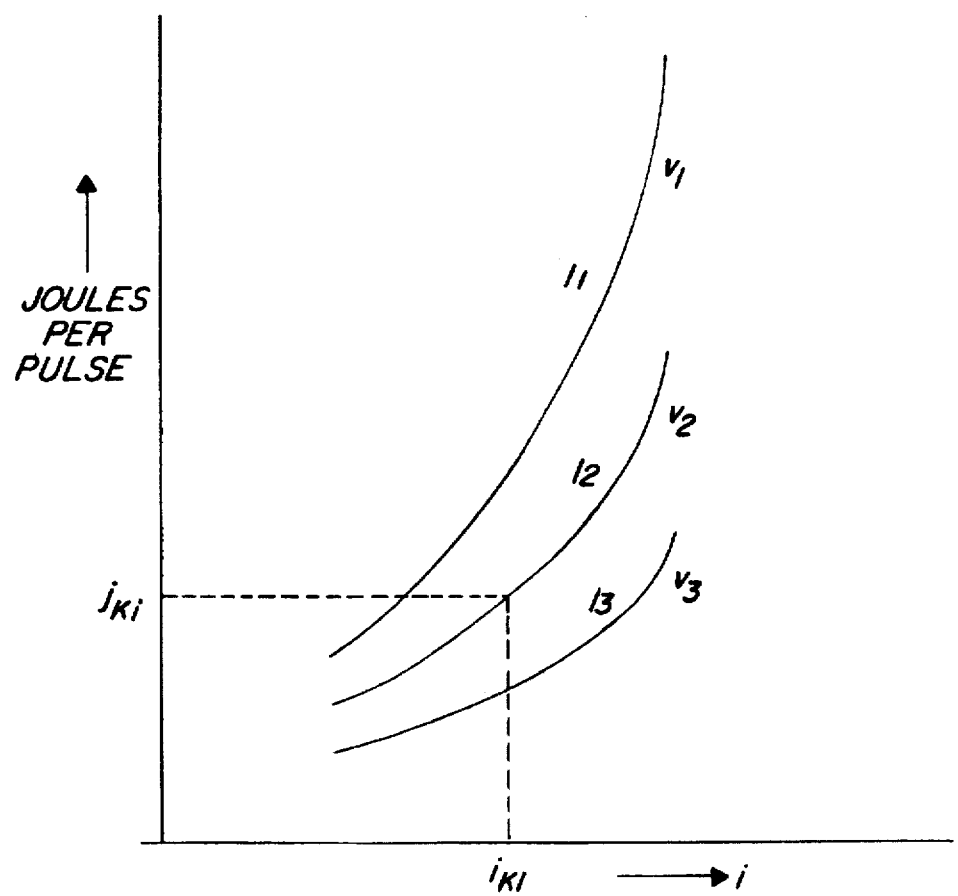
FIG. 14 illustrates semiconductor loss as a function of instantaneous voltage and current.
Figure 15:
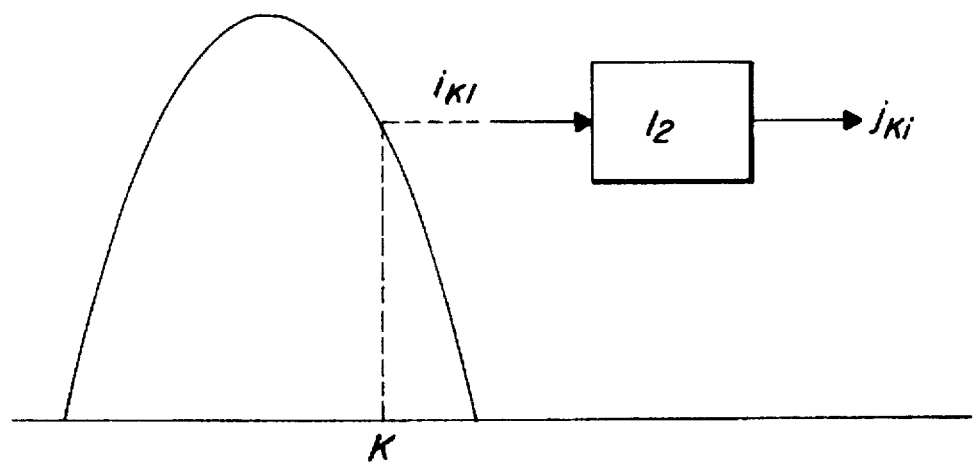
FIG. 15 illustrates computation of semiconductor loss for sine wave operation.
Figure 16:
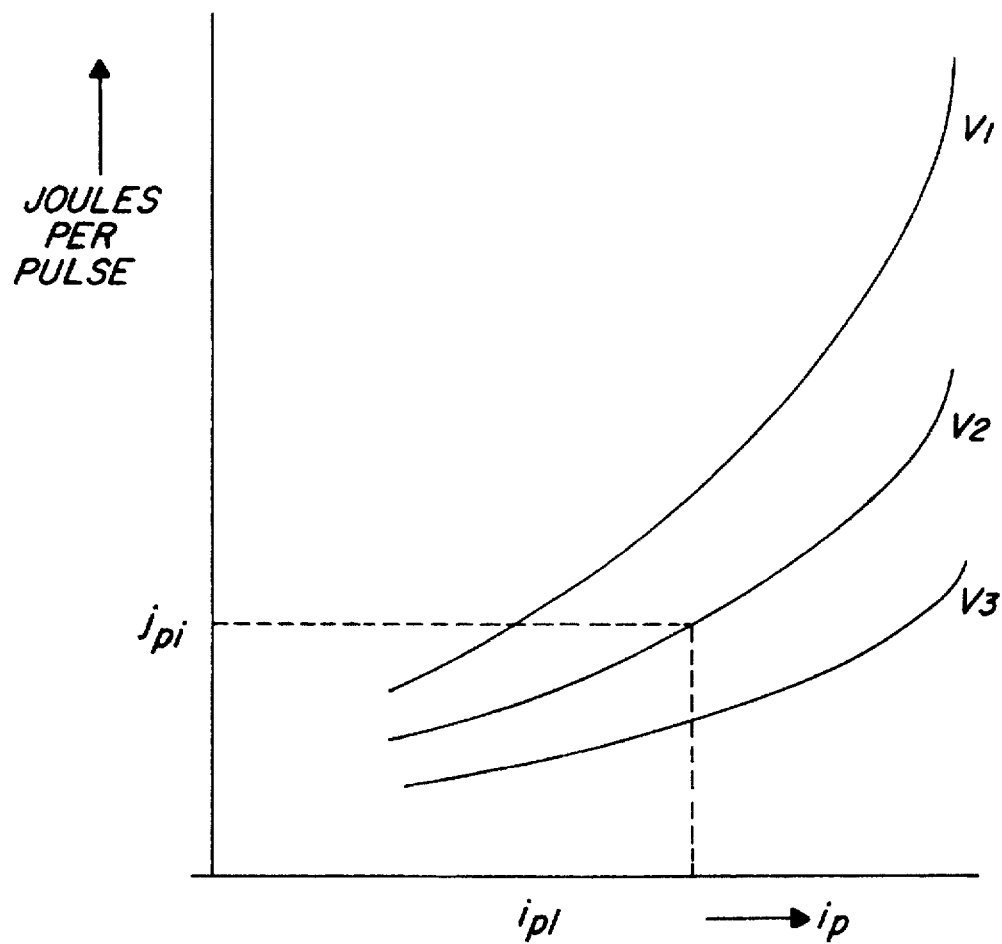
FIG. 16 illustrates semiconductor loss as a function of sine wave peak current and dc voltage.

The GTO turn on losses and the turn off losses of both GTO and diode are given by the manufacturer as a function of instantaneous current and voltage as shown in FIG. 14. If the current is assumed to be sinusoidal and if the switching frequency is assumed to be very high compared to the fundamental frequency then the losses can be approximated using the following method. Consider a sine wave like the one in FIG. 15 whose amplitude is $i_{p1}$. If it is divided into 2 m equal intervals (m intervals for 180 degrees) where m is large then the switching loss can be calculated by averaging the sum of losses and is given by $$j_{pi}=(0.5/m)\sum_{k=0}^{m}j_{ki}$$

where $j_{p1}$ is the average loss over the complete cycle and $j_{k1}$ is the loss due to an instantaneous current $i_{k1}$ at the same voltage. By repeating this step for various values of peak current, a family of curves can be obtained as shown in FIG. 16 which gives average loss as a function of peak sinusoidal current and dc link voltage.

If $f_{sw}$ is the switching frequency and f is the fundamental frequency, then the GTO turns off $f_{sw}$ times per second due to PWM operation and f times per second due to the natural reversal of voltage required for the fundamental current. Therefore the GTO turn off losses $P_{goff}$ can be calculated by $$P_{goff}=j_{poff}*(f_{sw}+f)$$

where $j_{poff}$ is the average turn off loss of the GTO for the given voltage and peak sinusoidal current obtained in the manner described above.

The GTO turn on losses $P_{gon}$ can be calculated in the same way except that the number of turn on events is less by the fundamental frequency due to natural commutation from diode to GTO. Therefore the turn on loss is given by $$P_{gon}=j_{pon}*(f_{sw}-f)$$

where $j_{pon}$ is the average turn on loss of the GTO.

The diode turn off losses are similar to GTO turn on losses and is given by $$P_{dof}=j_{poff}*(f_{sw}-f)$$

where $j_{poff}$ is the average turn off loss of the diode. There are many other ways to calculate GTO turn-off and conduction losses. The present method describes a procedure which minimizes on-line computation.

Figure 17:
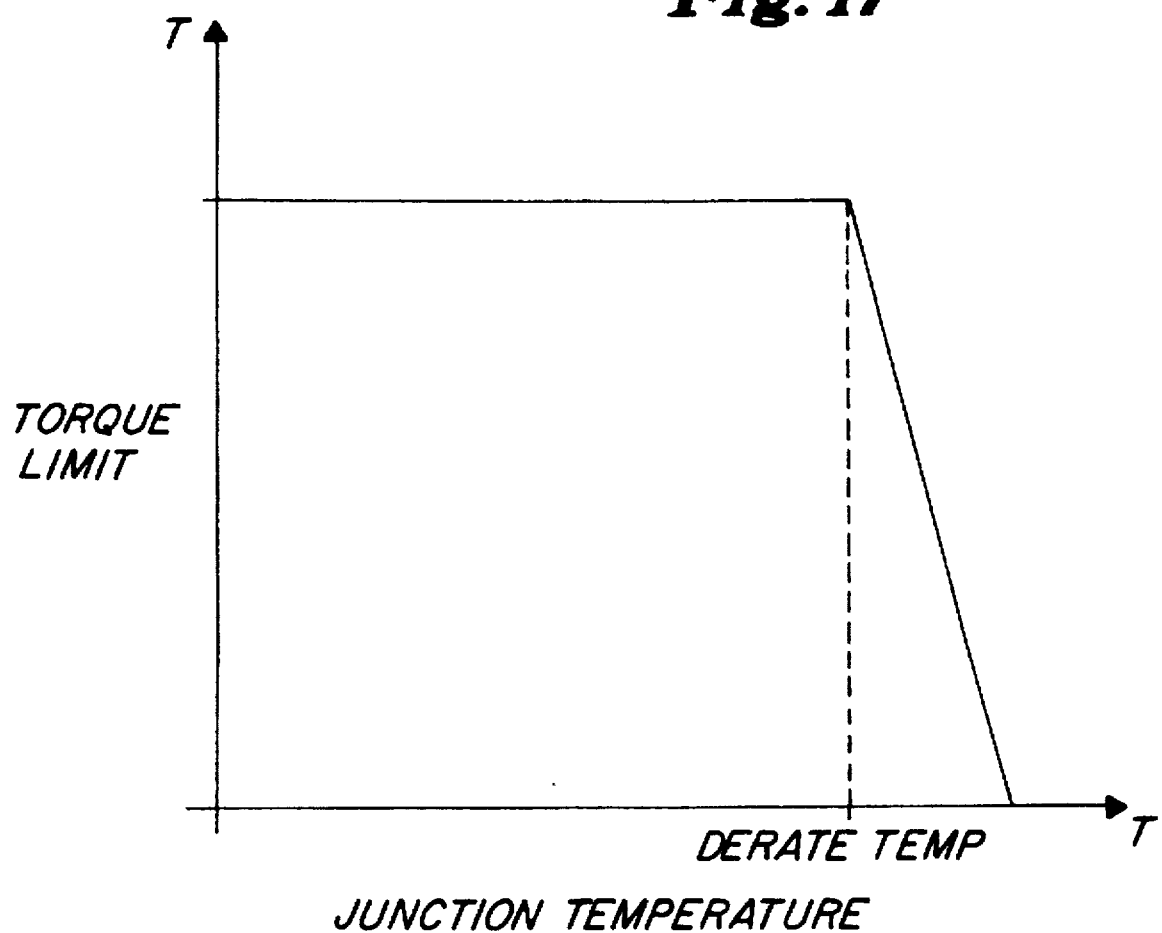
FIG. 17 illustrates deration as a function of semiconductor junction temperature.

There are many possible ways of derating the inverter operation and cooling control. For example, consider a system in which the blower operates continuously and a torque limit is imposed as a function of junction temperature of GTO. A linear deration from full torque to 0 torque at maximum junction temperature is shown in FIG. 17. A second level of protection causes the inverter to be disabled when a predetermined junction temperature is reached. If a variable speed blower is used to cool the inverter, the blower can be enabled based on (a) the junction temperature; (b) the junction temperature and the rate of change of junction temperature; (c) the power dissipation in the semiconductor; (d) the power dissipation in the semiconductor and the junction temperature and/or the rate of change of junction temperature, for example.

Figure 18:
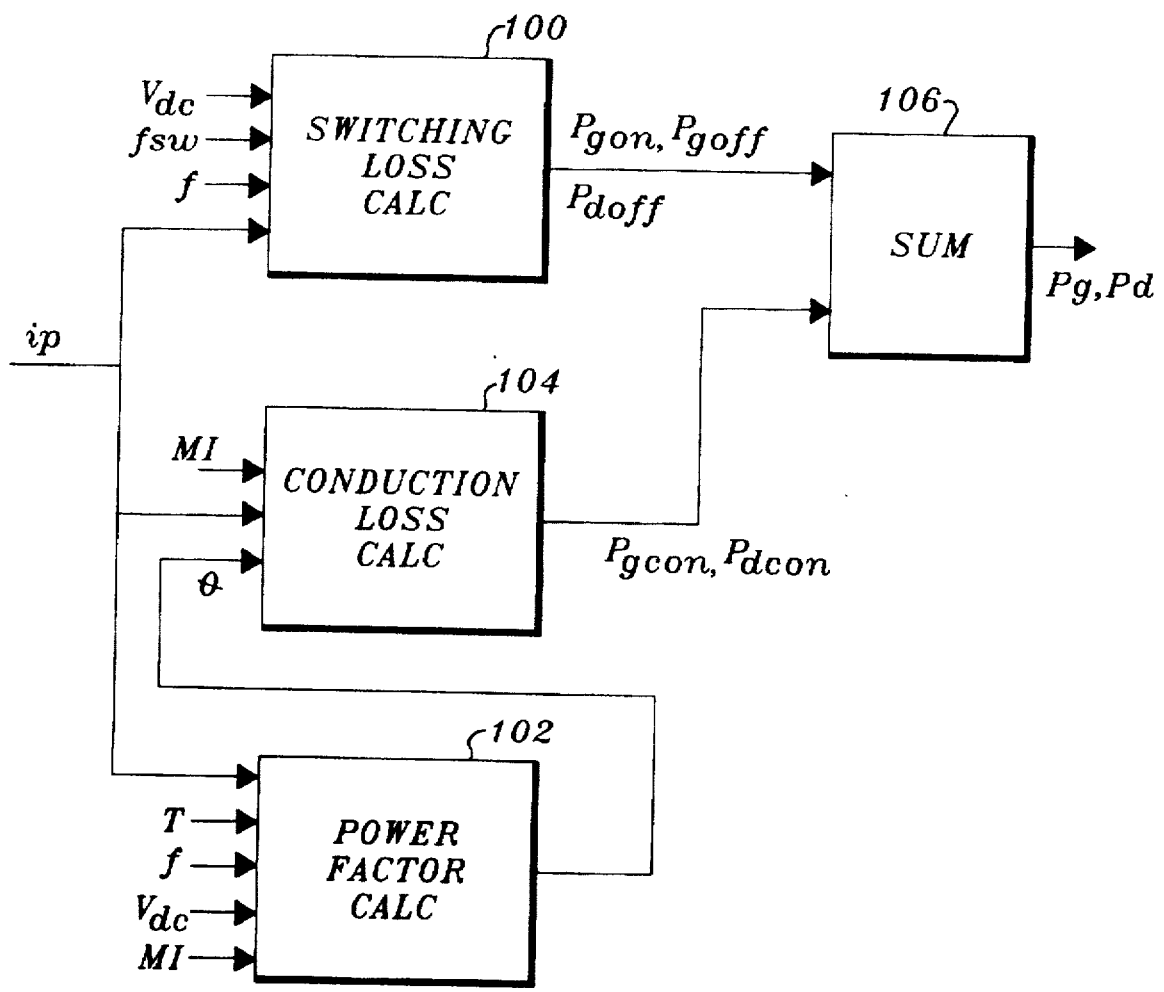
FIG. 18 is a function block diagram for calculation of semiconductor losses.

Referring to FIG. 18, the procedures described above for determining power dissipation in the semiconductor devices, i.e., GTO switching devices and diodes, is summarized in functional block diagrams. At block 100, the switching losses $P_{gon}$, $P_{goff}$ in the GTO device and losses $P_{doff}$ in the diode are calculated from the monitored values of applied DC voltage (the DC link voltage) $V_{dc}$, the switching frequency fsw of the GTO device, the fundamental output current frequency f and the magnitude of current $i_p$. The switching loss equations are set forth in the preceding description and are preferably implemented in the microprocessor based control system.

At block 102, the power factor is calculated as previously described based on values of $i_p$, torque T, fundamental output current frequency f, dc voltage $V_{dc}$ and modulation index MI. Block 102 calculates the power factor angle Θ and supplies that value to block 104 which computes the GTO conduction losses $P_{gcon}$ and diode conduction losses $P_{dcon}$. The values of $P_{gcon}$ and $P_{dcon}$ are based on Θ, $i_p$ and MI. Finally, the total losses for the GTO device $P_g$ and diode $P_d$ are computed in the summing block 106.

Once the values of $P_g$ and $P_d$ are computed, the system can determine an estimated value of junction temperature based on the electronic model.

Figure 19:
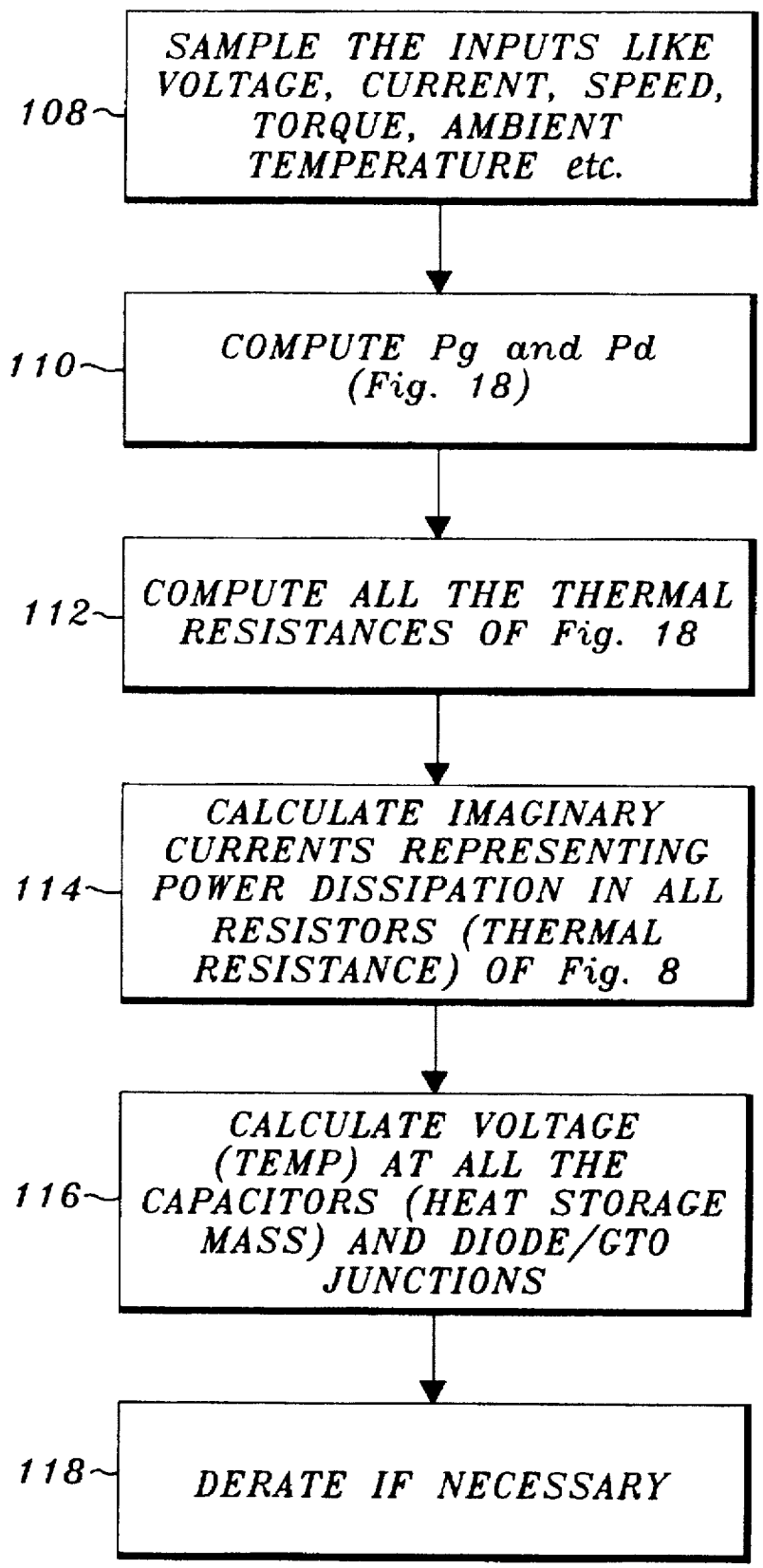
FIG. 19 is a flow chart illustrating computation of semiconductor junction temperature.

Referring to FIG. 19, there is shown a flow chart of the calculations implemented by control logic 60 (although system controller 61 may provide some functions). The control logic 60 samples input and output voltages, current, speed, motor torque, ambient temperature and other variables discussed above, block 108. Based on these sampled values and the computed values of $P_g$ and $P_d$, block 110, the thermal resistance model of FIG. 8 is modified as necessary, block 112. As noted, some of the resistor values are effected by cooling air flow. Using the thermal resistance model, the imaginary currents in all the thermal resistances (the imaginary resistors) are computed, block 114. Next, the voltage at all capacitors (representing heat storage mass) is calculated, block 116. For example, the voltage $V_{C1}$ across capacitor $C_1$ at time N+1 is given by the equation:

$$V_{C1(N+1)}=V_{C1(N)}+(i_{RS11}+i_{RS12}+i_{RS13})\, dt/C1$$

where N is a sample time and dt is the delta time between samples or calculations.

Once temperature is calculated, the system makes a determination of whether or not to derate, i.e., restrict, available power so as to protect the semiconductors from overheating, block 118.

While the invention has been described in what is presently considered to be a preferred embodiment, many variations and modifications will become apparent to those skilled in the art. Accordingly, it is intended that the invention not be limited to the specific illustrative embodiment but be interpreted within the full spirit and scope of the appended claims.

What is claimed is:

1. A method for providing thermal protection for forced air cooled power electronic semiconductors without direct measurement of semiconductor temperature, the semiconductors being mounted on a heat sink over which cooling air is blown, the method comprising the steps of:

measuring the temperature of the cooling air prior to passage over the heat sink;

measuring atmospheric pressure of the cooling air;

determining the volumetric air flow rate of the cooling air;

computing, from the cooling air temperature, pressure and volumetric flow rate, the cooling air mass flow rate;

calculating power dissipation in the semiconductors;

estimating heat sink and semiconductor temperatures from the calculated power dissipation and computed cooling air mass flow rate; and limiting semiconductor power dissipation so as to restrict semiconductor temperature to a safe operating value.

2. The method of claim 1 and including the step of controlling the volumetric air flow rate to regulate semiconductor temperature.

3. The method of claim 1 wherein the step of calculating power dissipation includes the steps of:

computing switching losses in the semiconductors from monitored values of applied DC voltage, switching frequency, fundamental output current frequency and current magnitude;

calculating power factor from measured values of current, torque, fundamental output current frequency, applied DC voltage and modulation index;

computing semiconductor conduction losses from the calculating power factor, measured current and modulation index; and summing the switching losses and conduction losses to obtain power dissipation.

4. The method of claim 1 wherein the step of estimating includes the steps of:

creating an electronic model simulating the thermal characteristics of the heat sink and semiconductors; and computing semiconductor temperature from the electronic model based on computed power dissipation and cooling air mass flow rate.

5. The method of claim 1 wherein the cooling air is supplied from a blower and the step of computing the cooling air mass flow rate comprises the steps of:

measuring cooling air flow rate at $$\left(\frac{ft^3}{MIN}\right)$$

a fixed blower speed;

computing cooling air flow rate $$\left(\frac{ft^3}{MIN}\right)$$

at other blower speeds in direct proportion to the flow rate at the fixed speed;

computing a standard air mass flow rate from the relationship $$rate = \left(\frac{ft^3}{MIN}\right)\left(\frac{.075\ lbs}{ft^3}\right) = R\frac{lbs}{MIN}$$

computing an actual air mass flow rate from the standard air mass flow rate in which actual flow rate is determined from:

$$rate\ (actual) = R\frac{lbs}{MIN} / [(0.0566613)T°R]/P,$$

where R is mass flow, T is temperature and P is atmospheric pressure.

* * * * *